(12) United States Patent
Conboy et al.

(10) Patent No.: US 6,403,905 B1
(45) Date of Patent: Jun. 11, 2002

(54) RETICLE STOCKING AND SORTING MANAGEMENT SYSTEM

(75) Inventors: Michael R. Conboy; Elfido Coss, Jr., both of Austin; Russel Shirley, Pflugerville, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,874

(22) Filed: Feb. 2, 2000

(51) Int. Cl.$^7$ ................................................ B07C 5/00
(52) U.S. Cl. ..................... 209/563; 209/630; 209/933; 250/548
(58) Field of Search ................................. 209/577, 583, 209/630, 559, 563, 933; 250/548

(56) References Cited

U.S. PATENT DOCUMENTS 5,325,972 A * 7/1994 Prydtz et al. ............... 209/552
5,972,727 A    10/1999 Ryan et al. ............. 250/548 X
5,990,437 A * 11/1999 Coutant et al. ............. 209/583

* cited by examiner

Primary Examiner—Tuan N. Nguyen

(57) ABSTRACT

A system and method for stocking and sorting reticles used in a semiconductor fabrication facility, the facility having a material handling system that presents a reticle to a photolithography process area. In an example embodiment of the reticle management system, a reticle storage system and a reticle sorting apparatus are coupled to a host system that is adapted to track and control the movement of reticles in the material handling system. The host system is capable of interfacing with a management input module that integrates management directives into the reticle flow plan in the manufacturing process. The result is a reticle management system that is flexible enough to manage a finite number of reticles and pods in minimizing the delivery time of a reticle to the desired location while responding to changing conditions external to the manufacturing process.

25 Claims, 2 Drawing Sheets

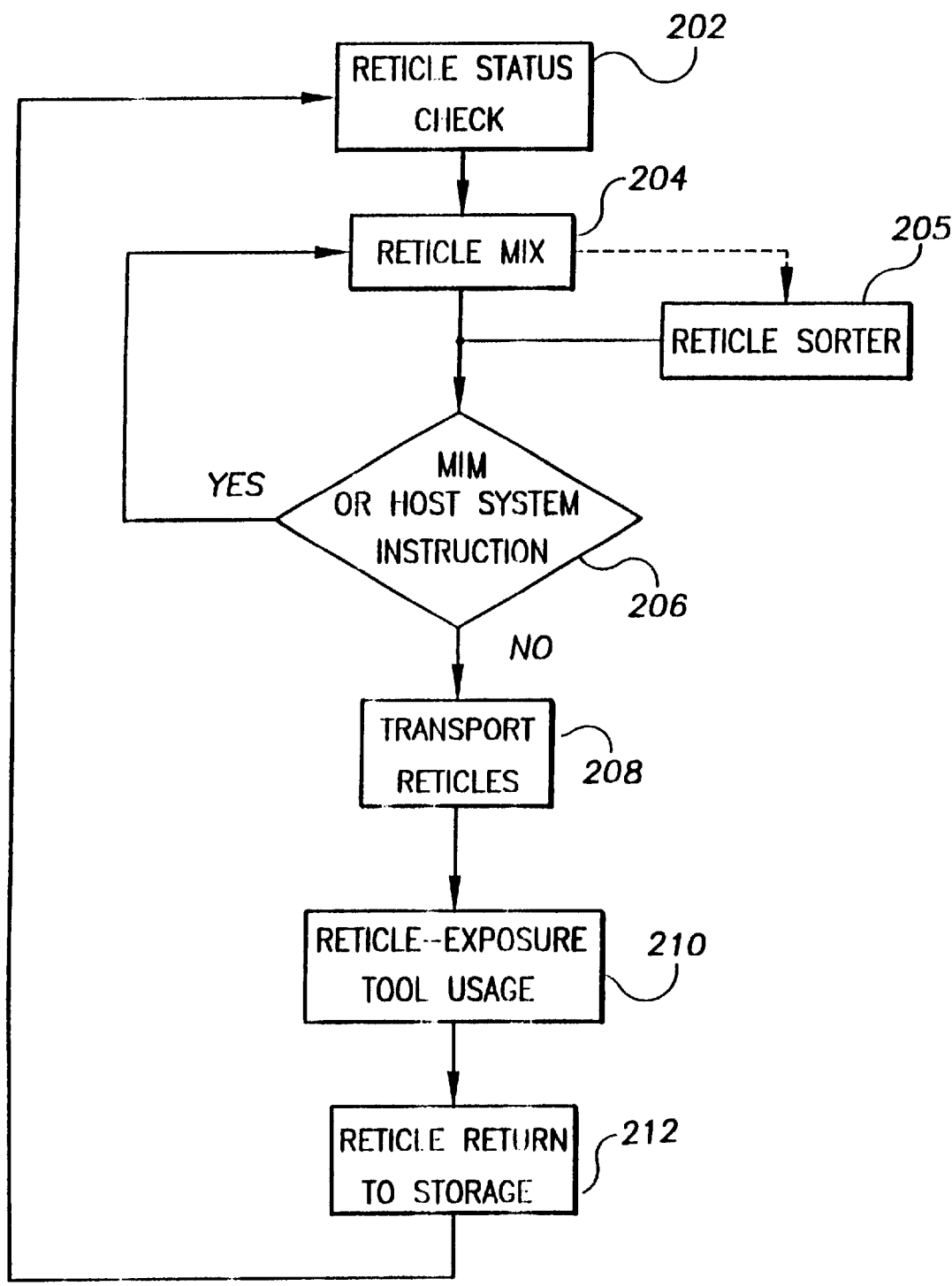

RETICLE STOCKING AND SORTING MANAGEMENT SYSTEM

RELATED APPLICATIONS

The present invention generally relates to manufacturing processes and equipment using masks and masking structures and, more particularly, to a system and method for managing reticles and reticle stocking locations as part of an entire semiconductor processing system.

BACKGROUND OF THE INVENTION

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant. The carriers can move material in lots, primarily between stocking locations, such as production wafers, test wafers, or empty cassettes to ensure that the process is moving smoothly.

Integrated into the wafer processing line is a photolithography process that occupies a substantial amount of floor space and involves a high level of capital investment to maintain. A wafer is subjected to a photolithography process of some type and usually involves applying a layer of photoresist material, such as silicon dioxide, over the surface of a wafer using a coating machine. The wafer is then moved to an exposure tool, such as a photolithography stepper that exposes the photoresist layer to a patterned light source. The light source is patterned using a mask structure or a reticle. The reticle contains clear and opaque features that generally define the pattern to be created in the photoresist layer. The exposed photoresist is then developed and regions of the photoresist are dissolved leaving a pattern on the photoresist layer. The exposed portions of the underlying wafer are then subjected to further processing.

Depending on the type of IC device being manufactured, the wafer may be subjected to the photolithography process several times as layers are formed successively over prior layers to ultimately form the semiconductor device. To perform the various photolithography processes, a semiconductor plant has a photolithography area that has a number of steppers that utilize an entire cataloged library of reticles. The number of reticles that need to be readily available can easily exceed one thousand, due to the number of different products that can be manufactured in one facility, with each reticle having a replacement cost of about $1.5K. The reticles are usually stored in a reticle storage system, centrally located within the photolithography area, and are cataloged by reticle identification number. The reticle(s) are transported via a conveyor system to the particular stepper(s) in need of a certain reticle. One of the problems with managing reticles is that they are very delicate structures and can be damaged easily by excessive handling. They also need to be routinely inspected to ensure that they are still viable for use in making the intended product.

Cycle times of the photoresist process are limited by the wafer processing system's limited resources to manage all of the options available on the processing line. Manual intervention is required in managing the finite number of reticles in inventory, the limited number of the duplicate reticles available and the finite number of pods that move the reticles around the photolithography area. Further, midstream changes in production cannot be acted upon as quickly or efficiently due to the lack of centralized management of reticles and reticle storage locations. In view of the above, there is a need for a system and method that will allow for on-demand reticle selection in order to improve cycle time and flexibility on the manufacturing line and for a system that will to reduce the amount of handling of reticles.

SUMMARY OF THE INVENTION

The present invention is directed to addressing the above, and other needs in connection with improving efficiencies of reticle stocking and sorting processes.

Semiconductor fabrication facilities have material handling systems that manage production/test wafers as well as empty cassettes and carriers throughout the system. Reticles and reticle storage systems have to be manually integrated with these subsystems and any changes to the reticle flow or storage plan must be manually coordinated by the operators on the line. This has led to delays in the system in processing the wafers and inefficiencies in manufacturing. One aspect of the invention is directed to an automated and integrated reticle management system that reduces delays caused by event changes in the line or management directives external to the line, and that reduces the handling of reticles by having a system that allocates reticles more precisely.

According to another aspect of the invention, a mask stocking and sorting management system is used in a manufacturing facility having a material handling system that presents a mask to a photolithography process area. The system includes an arrangement of pods, each of the pods including at least one mask, and a host system adapted to rearrange the pods at a mask storage location as a function of a mask identification code and an externally provided directive indicating a masking sequence change. In another related embodiment at least one mask sorting apparatus can be coupled to the mask storage system and to the host system to provide more flexibility in the overall mask management system. An important advantage is that the host system reduces the delivery time of a mask to the photolithography area and reduces the number of buffer pods used in the material handling.

According to another aspect of the present invention, a method of stocking and sorting masks is used in a manufacturing facility having a material handling system for presenting a mask to a photolithography process area. An arrangement of pods is provided with each of the pods including at least one mask. The pods are then rearranged at a mask storage location as a function of a mask identification code and an externally provided directive indicating a masking sequence change. An important advantage is that the method reduces the delivery time of a mask to the photolithography area and reduces the number of buffer pods used in the material handling.

In yet another aspect of the present invention, a method of stocking and sorting masks in a manufacturing process involves a photolithography process area and a material handling system. The method includes conducting a status check of all of the masks in the manufacturing process and then preparing a mix of masks within a mask storage system to be transported to the photolithography area via the material handling system. A host system is polled to determine the existence of an instruction change that can change the flow of masks in the manufacturing process. The masks are then used in the photolithography process, are returned to the storage location and the status of the masks are communicated to the host system.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2 illustrates a process flow for a reticle management system in accordance with an example embodiment of the invention.

Figure 1:
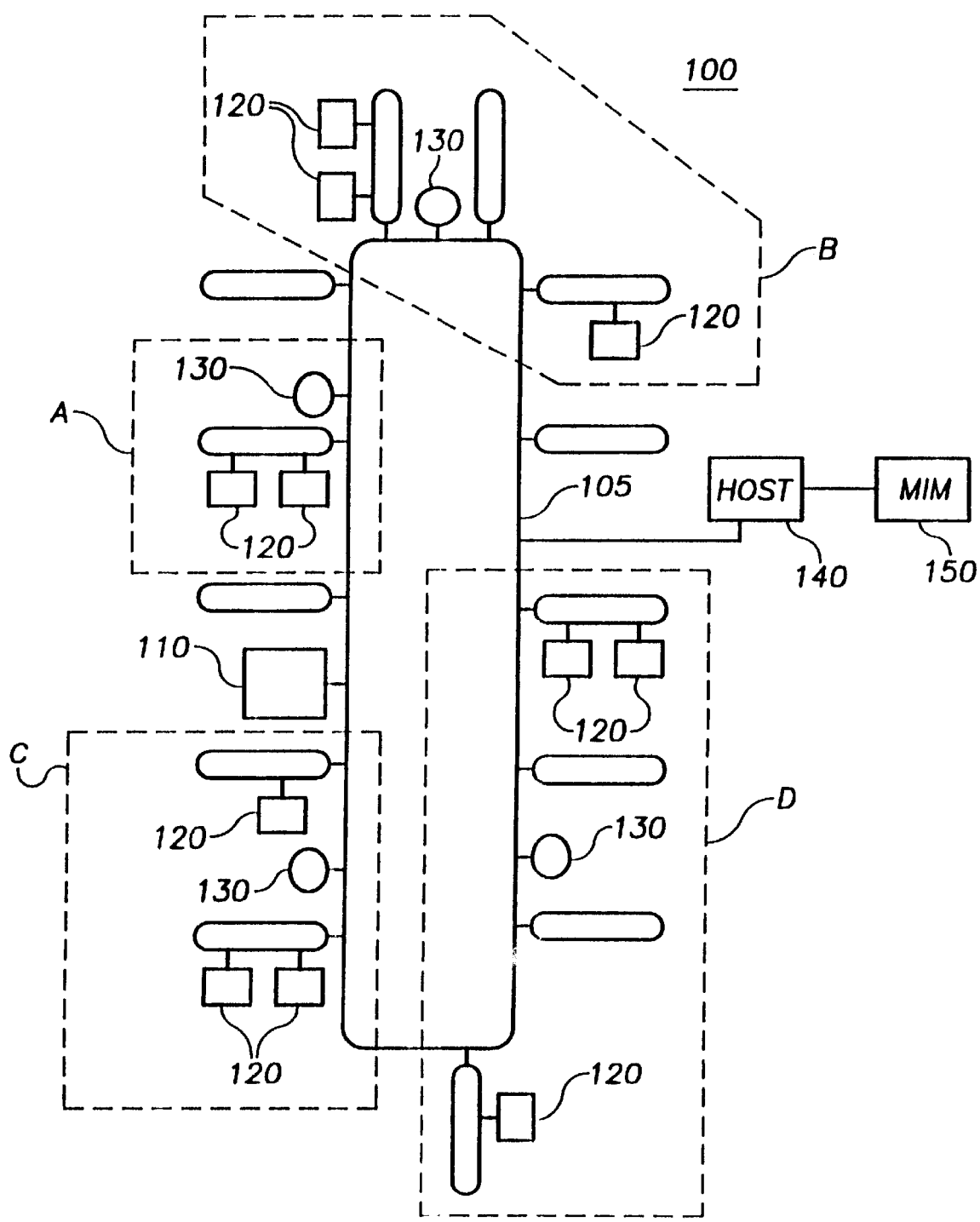
FIG. 1 illustrates an exemplary semiconductor fabrication facility in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a system and method for managing and handling masks in an IC manufacturing environment, particularly where an automated material handling system is used. It has been discovered that the present invention is particularly suited for stocking and sorting reticles in a semiconductor fabrication facility such that delivery time of the reticle is minimized while the system is responsive to changing conditions external to the manufacturing process. While the present invention is not so limited, a better understanding of the invention will be found by reading the detailed description and exemplary embodiments that follow. Moreover, while the exemplary embodiment is used primarily in a semiconductor wafer processing facility, it should be appreciated that the invention is not necessarily so limited.

In an example embodiment, a mask stocking and sorting management system is used in a manufacturing facility having a material handling system that presents a mask to a photolithography process area. The system includes an arrangement of pods, each of the pods including at least one mask, and a host system adapted to rearrange the pods at a mask storage location as a function of a mask identification code and an externally provided directive indicating a masking sequence change. In another related embodiment at least one mask sorting apparatus can be coupled to the mask storage system and to the host system to provide more flexibility in the overall mask management system. An important advantage is that the method reduces the delivery time of a mask to the photolithography area and reduces the number of buffer pods used in the material handling.

In another application of the present invention, reticles are substituted for the masks. The reticle management system can include a management input module that is coupled to the host system to integrate high level management directives into the selection and usage of reticles. Reticles and reticle storage locations can be managed as a system, however reticle sorters can be optionally integrated to provide more flexibility in the reticle management system closer to the steppers.

According to the present invention, FIG. 1 illustrates an exemplary fabrication facility having a reticle stocking and sorting management system that is integrated into a wafer processing system. The exemplary fabrication facility 100 includes a transportation path 105, such as a conveyor belt, for moving reticles around the facility, but primarily within the photolithography area, a reticle storage system 110 (storage of reticles within cassettes) and a number of photolithography exposure tools such as steppers 120. The steppers generally use a number of different reticles for fabricating layers of semiconductor wafers. The invention is however not necessarily limited to the use of photolithography steppers, but extends to cover any type of exposure tool that uses a reticle or a mask to transfer a pattern onto a wafer. While not shown, it should be appreciated that each of the reticle storage system 110, reticle sorters 130 and photolithography steppers 120 are communicatively coupled to a host system 140 and operate under instructions from the host system. The reticle storage system 110 may also include a buffer for storing reticles and cassettes and an inspection system for inspecting various characteristics of the reticles that are transmitted to the host system for database storage. A sorting system capable of rearranging the reticles within the cassettes as dictated by the host system is also included in reticle storage system.

In another embodiment, one or more reticle sorters 130 each associated with a group of one or more of the photolithography steppers 120 is incorporated into the reticle management system and interfaces with steppers 120. The reticle sorters can interface with multiple storage systems that can be incorporated into the current wafer processing system. The illustrated embodiment includes four reticle sorters 130 each of which handle the reticle sorting for an associated cell of photolithography steppers 120. Exemplary cell groupings A, B, C, and D are shown in FIG. 1. For many applications, one reticle sorter for every 2 to 8 photolithography steppers would be suitable. A number of pods with reticles stored therein are stored within the reticle sorters and within the reticle storage system. Path 105 can include a mechanism, such as a conveyor system, for coupling the reticle storage system and the reticle sorter to the material handling system. A host system 140 is coupled to the reticle sorter, the reticle storage system and the material handling system. The host system is programmed to track and control the movement of reticles and the pods in the material handling system such that the delivery time of a reticle to the photolithography process area is minimized. In one specific implementation, the reticle sorter 130 is implemented as described in U.S. Pat. No. 5,972,727 issued Oct. 26, 1999 to Ryan et al., entitled "Reticle Sorter," which is herein incorporated by reference.

The reticle management system further includes a management input module 150 that is coupled to host system 140 and the material handling system for integrating management directives into the reticle management system. Management input module 150 can change the selection of masks to be used in the manufacturing process in response to high level directives that may need to override the current manufacturing program. In one embodiment, module 150 incorporates a business rule module that interfaces with the host system and material handling system to direct other portions of the manufacturing line to work with the reticle management system to comply with the instructions coming from management module 150.

The management input module is also coupled to subsystems that include empty cassette management, test wafer management, carrier management and a business rules module. This ensures that the reticles are managed integrally with these other materials that are important in the wafer manufacturing system. The management input module also assists in out of order processing management of masks and wafers that may occur due to the integration of new instructions into the wafer manufacturing system. For further details on the business rule module and its mode of operation, reference is made to the concurrently filed patent application Ser. No. 09/496,205 entitled "Integration of Business Rule Parameters in Priority Setting of Wafer Processing," filed on Feb. 2, 2000, with which is herein incorporated by reference.

Host system 140 can be programmed to create a pod sequence at the reticle storage system location in order to generate the desired mix of reticles as they are being released to the photolithography area. The host system can also be programmed to diminish conflict problems when more than one location in the photolithography area requires use of the same reticle at about the same time. In an alternative embodiment, the host system can manage the reticle stocking and sorting operations with only reticle stocking locations that are coupled to the material handling system via a transport path. However, adding reticle sorters to the system adds to the flexibility of the management system. The host system is programmed to work with a finite number of pods and reticles since these resources are expensive and supply is limited.

Referring to FIG. 2, a flowchart 200 illustrates the steps that the reticle management system follows to manage the reticles, the reticle sorters and the reticle storage locations as a subsystem of the wafer manufacturing system. The host system conducts a reticle status check at 202 by reticle identification number to determine location and condition of the entire reticle inventory. The reticle mix at 204 is prepared for release into the material handling system. Reticles are selected by the hosts system based on product types and are associated with a particular wafer lot. In an alternative system, the reticle mix proceeds to a reticle sorter at 205, if the system has reticle sorters, before polling at 206 the management input module or host system to determine if additional instructions have been issued that might change the mix or flow of reticles. Once the reticles arrive at 205, the reticle sorters can also poll at 206 the system for new instructions. New instructions can initiate a new reticle mix at either the reticle storage location or the reticle sorter. If no new instructions are provided, the reticles are transported at 208 to the photolithography tools at 210. The reticles are then returned at 212 to the either the sorter or the storage location and can optionally be inspected before being stored to ensure that the reticles are still viable for manufacturing use. Their status is then registered in the host system database at 202.

As noted above, the present invention is applicable to a number of techniques for managing masks in an integrated circuits manufacturing system. Accordingly, the present invention should not be considered limited to the particular examples described above, but rather should be understood to cover all aspects of the invention as fairly set out in the attached claims. For instance, while the management of reticles in an automated material handling systems of a semiconductor facility is illustrated, the invention extends to cover other the management of different types of masks in different environments. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A mask stocking and sorting management system for use in a manufacturing facility having a material handling system that presents a mask to a photolithography process area, comprising:

an arrangement of pods, each of the pods including at least one mask; and a host system adapted to rearrange the pods at a mask storage location as a function of a mask identification code and an externally provided directive indicating a masking sequence change.

2. The system of claim 1, further including a management input module coupled to the host system for integrating management directives that will change the selection of masks used in the manufacturing process.

3. The system of claim 1, wherein the host system reduces the delivery time of a mask to the photolithography area and reduces the number of buffer pods used in the material handling.

4. The system of claim 1, wherein the host system is programmed to diminish conflict problems when more than one location in the photolithography area requires use of the same mask at about the same time.

5. The system of claim 1, wherein the host system tracks the movement of masks and stores the information in a database.

6. The system of claim 1, further including an additional mask storage location system that is coupled to the host system and to the material handling system.

7. A mask stocking and sorting management system for use in a manufacturing facility having a material handling system that presents a mask to a photolithography process area, comprising:

an arrangement of pods, each of the pods including at least one mask;

at least one mask sorting apparatus coupled to the material handling system; and a host system adapted to rearrange the pods at a mask storage location and the mask sorting apparatus as a function of a mask identification code and an externally provided directive indicating a masking sequence change.

8. The system of claim 7, further including a management input module coupled to the host system for integrating management directives that will change the selection of masks used in the manufacturing process.

9. The system of claim 8, wherein the masks are selected based on product types, the masks being associated with a particular wafer lot.

10. The system of claim 7, wherein the host system tracks the movement of masks and stores the information in a database.

11. The system of claim 7, wherein the plurality of pods and masks include a predetermined number of pods and masks.

12. The system of claim 7, wherein the plurality of masks includes a plurality of reticles.

13. The system of claim 7, wherein the host system reduces the delivery time of a mask to the photolithography area and reduces the number of buffer pods used in the material handling.

14. The system of claim 8, wherein the management input module is coupled to subsystems that include empty cassette management, test wafer management, carrier management and business rules module.

15. The system of claim 8, wherein the management input module assists in out of order processing management of masks and wafers.

16. The system of claim 7, wherein the host system is programmed to diminish conflict problems when more than one location in the photolithography area requires use of the same mask at about the same time.

17. A system for stocking and storing masks for use in a manufacturing facility having a material handling system for presenting a mask to a photolithography area, comprising:

means for providing an arrangement of pods, each of the pods including at least one mask; and means for rearranging the pods at a mask storage location as a function of a mask identification code and an externally provided directive indicating a masking sequence change.

18. The system of claim 17, wherein mask rearranging means includes rearranging pods at a mask sorting apparatus.

19. A method of stocking and sorting masks used in a manufacturing facility having a material handling system for presenting a mask to a photolithography process area, the method comprising:

providing an arrangement of pods, each of the pods including at least one mask; and rearranging the pods at a mask storage location as a function of a mask identification code and an externally provided directive indicating a masking sequence change.

20. The method of claim 19, wherein rearranging the pods includes the step of integrating management directives indicating a masking sequence change.

21. The method of claim 19, further including the step of sorting masks proximate to the photolithography area.

22. The method of claim 19, further including the step of providing an additional mask storage location.

23. A method of stocking and sorting masks in a manufacturing process having a photolithography process area and a material handling system, the method comprising:

conducting a status check of masks in the manufacturing process;

preparing a mix of masks within a mask storage system to be transported to the photolithography area via the material handling system;

polling a host system to determine existence of an instruction change that can change the flow of masks in the manufacturing process;

using masks in the photolithography process; and returning masks to the storage location and communicating status to the host system.

24. The method of claim 23, wherein the step of polling the host system includes polling the management input module to determine existence of an instruction change that can change the selection of masks to be used in the manufacturing process.

25. The method of claim 23, further including the step of transporting the masks to a mask sorter apparatus after preparing the mix of masks.

* * * * *

UNITED STATES PATENT AND TRADEMARK OFFICE
CERTIFICATE OF CORRECTION

PATENT NO. : 6,403,905 B1  Page 1 of 1
DATED : June 11, 2002
INVENTOR(S) : Conboy et al.

It is certified that error appears in the above-identified patent and that said Letters Patent is hereby corrected as shown below:

<u>Column 2,</u>
Line 11, before "reduce" please delete "to".

<u>Column 4,</u>
Line 31, before "reticle" please insert -- a --.

<u>Column 5,</u>
Line 54, before "either" please delete "the".

Signed and Sealed this

Nineteenth Day of November, 2002

Attest:

Attesting Officer

JAMES E. ROGAN
*Director of the United States Patent and Trademark Office*